(12) United States Patent
Yap (10) Patent No.: US 9,197,210 B1
(45) Date of Patent: Nov. 24, 2015

(54) PROGRAMMABLE LOGIC DEVICE WITH A SELF-POWER DOWN MECHANISM

(71) Applicant: Altera Corporation, San Jose, CA (US)

(72) Inventor: Chee Wai Yap, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/223,949

(22) Filed: Mar. 24, 2014

Related U.S. Application Data (62) Division of application No. 13/353,246, filed on Jan. 18, 2012, now Pat. No. 8,717,062, which is a division of application No. 12/172,054, filed on Jul. 11, 2008, now Pat. No. 8,106,680.

(51) Int. Cl.
  *H03K 19/177* (2006.01)
  *H03K 19/173* (2006.01)
  *H03K 19/00* (2006.01)

(52) U.S. Cl.
  CPC .................. *H03K 19/0008* (2013.01)

(58) Field of Classification Search
  CPC ................ H03K 19/1776; H03K 19/17772; H03K 19/17784
  USPC .......... 326/38, 33, 16; 327/198, 544; 713/320
  See application file for complete search history.

(56) References Cited

U.S. PATENT DOCUMENTS

| | | | |
|---|---|---|---|
| 6,486,718 B1 | 11/2002 | Stelle et al. | |
| 7,295,036 B1 | 11/2007 | Zaveri et al. | |
| 7,376,037 B1 | 5/2008 | Law et al. | |
| 7,498,835 B1 | 3/2009 | Rahman et al. | |
| 8,327,379 B2 * | 12/2012 | Maruyama | 718/108 |

* cited by examiner

*Primary Examiner* — Daniel D Chang
(74) *Attorney, Agent, or Firm* — Womble Carlyle Sandridge & Rice, LLP (57) ABSTRACT

Apparatuses for reducing power consumption in a programmable logic device (PLD) with a self power down mechanism are disclosed. Methods and a machine readable medium for restoring a prior known state are provided. The prior known state is stored in a memory module before the PLD is powered down and the same state is restored from the memory module when the PLD is powered up. The memory module may be an internal or an external non-volatile or volatile memory source. One sector of the memory may be used to store the previous known state. The memory sector can be partitioned into different sections. One section may be used as a header section associated with a data storage section. Partitioning the memory sector into different sections and utilizing multiple addresses from each section ensure less read and write cycles during the powering down and the powering up of the PLD.

15 Claims, 11 Drawing Sheets

PROGRAMMABLE LOGIC DEVICE WITH A SELF-POWER DOWN MECHANISM

This application is a divisional of U.S. patent application Ser. No. 13/353,246 filed on Jan. 18, 2012, which is a divisional of application Ser. No. 12/172,054 filed on Jul. 11, 2008, and entitled, "PROGRAMMABLE LOGIC DEVICE WITH A SELF-POWER DOWN MECHANISM." The disclosure of this related application is incorporated herein by reference for all purposes.

BACKGROUND

Description of the Related Art

The present invention relates to programmable logic devices (PLDs), and in particular to a self-power down mechanism for PLDs.

PLDs are reconfigurable components used in digital circuits. The function required must be programmed into the device before a PLD can be used. Field Programmable Gate Arrays (FPGAs) and Complex PLDs (CPLDs) are two examples of classes of PLDs. Both include non-volatile (e.g. EPROM, EEPROM, Flash EEPROM, etc.) or volatile (e.g. SRAM, DRAM, etc.) memory cells which can be configured to perform specific functions.

Power consumption is an important issue in most modern digital systems. Low power PLDs have power saving features to minimize power requirements for a specific application. However, in systems where power saving is crucial, such as a battery-powered system, the system should be put in a substantially reduced power consumption state when idle to reduce unnecessary power consumption. Many systems do not require the device to be powered up at all times. Powering components off and on is a valuable power savings technique. However, the device needs to be able to automatically retain and reload its state configuration data to ensure a seamless transition between power up and power down cycles.

Although some PLDs are able to reduce quiescent current, important state information may no longer be available upon power up. Often, the device's internal RAM contents are flushed when the system powers down. As a result, upon power up, the system needs to go through a time consuming reconfiguration sequence when full power is restored. Even if the state information is retained when the device is powered down, the device should be able to restore a state quickly enough upon power up. In other words, the operation should be transparent to the user.

Applications with frequent power up and power down cycles require short initialization time to increase product usability. To ensure that the system's operation is not interrupted when powering down the device, important state information needs to be retained so that operation can resume from a previous known state when the device is powered up again. To achieve a seamless transition when powering up or powering down a system, the system should be intelligent enough to initiate a power-down operation when needed and be able to retain all system information prior to powering down, and automatically restore the last saved state upon power-up.

Completely powering down a system when not in use has a number of advantages. Allowing the device to power-down, consuming substantially reduced current when idle, saves power. For example, a door open detection system (or many other systems for that matter) does not need to be powered up at all times. Such a system needs to be powered up only when the system detects an open door. As another illustrative example, portable electronic devices that can be powered down intermittently may operate for longer periods of time on their limited battery resources. It may be desired to power down a handheld game console after a period of inactivity and to restore the previous state of the game upon power up again. Therefore, it is highly desirable to not only have a PLD that has a self-power down mechanism, but also a method to restore a previous known state with a small number of read/write cycles.

SUMMARY

Embodiments of the present invention include apparatuses and methods for reducing power consumption in a programmable logic device (PLD) with a self-power down mechanism and also methods for storing and loading a previous known state on the PLD without going through excessive read/write cycles.

It should be appreciated that the present invention can be implemented in numerous ways, such as a process, an apparatus, a system, a device or a method on a computer readable medium. Several inventive embodiments of the present invention are described below.

In one embodiment, a method for reducing power consumption in a PLD is provided. The method includes detecting a quiescent state in the PLD through logic circuitry of the PLD. Then the previous known state is stored into a memory module with at least one sector allocated for storing configuration information of the previous known state. In one embodiment, the memory module can be a non-volatile memory. A power down operation is initiated and the PLD is put into a reduced power consumption state. The method further includes detecting an active signal within the PLD and initiating a power-up operation in the PLD. The PLD is put into an active power consumption state and restored to a previous known state upon powering up.

In another aspect of the invention, a method for storing and loading a previous known state on a PLD is provided. The method includes using a memory module with at least one sector. The sector is used to store configuration information of the previous known state. The sector is partitioned into a plurality of sections and a plurality of addresses in each section is utilized. One of the sections in the sector is a header section. Addresses or ranges of addresses in the header section correspond to addresses or ranges of addresses that hold configuration information of the previous known state in another section in the memory sector. The header section also keeps track of the last address written to in the data section.

Another embodiment describes a PLD with a self-power down mechanism. The PLD has an application module and a detecting element coupled to an input signal to the application module. The detecting element is used to detect a quiescent state in the PLD. The detecting element is also coupled to a controller element. The controller element is in turn coupled to a memory module in the PLD.

Yet another embodiment describes a system for controlling power in a PLD. The system includes a PLD with an onboard flash memory. An input of the PLD is coupled to a timeout detector. The timeout detector is used to identify a quiescent state in the PLD. A controller element is coupled to the timeout detector and the onboard flash memory. A circuitry that controls power to the PLD is also coupled to the controller element.

In another aspect of the present invention, a machine-readable medium encoded with machine-readable instructions is described. The machine-readable medium has instructions to examine a first bit of an address in a first section of a sector of a memory module, write to the first address, and store a last known state into an address in a second section of the memory sector. The machine-readable medium also contains instructions to read an address from the first section of the memory sector and load a previous known state from an address in the second section of the memory sector.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe methods for reducing power consumption in a programmable logic device (PLD) by putting a PLD in a reduced power consumption state. A previous known state is loaded back into the PLD when power is restored.

It will be obvious, however, to one skilled in the art, that the present invention may be practiced without some or all of these specific details. In other instances, well-known processes have not been described in detail in order not to unnecessarily obscure the present invention.

The embodiments described herein provide techniques to put a PLD in a reduced power consumption state when the PLD is in a quiescent state and to be able to load a previous state configuration upon power up. Embodiments described herein reduce the read and write cycles in the PLD when loading a previous known state. The system described, as one example of the embodiments, is intelligent enough to initiate a power down operation and retain important state information before putting the PLD in a reduced power consumption mode. Overall power consumption is reduced by having a self-power down mechanism in the PLD. The embodiments also provide a seamless or nearly seamless transition from a user's perspective between each power up and power down cycle by retaining the previous known state before powering down the PLD and restoring a prior state before powering up the PLD. In different embodiments, state information stored may include, among other things, pin configurations, and state machine data of a particular design.

Figure 1:
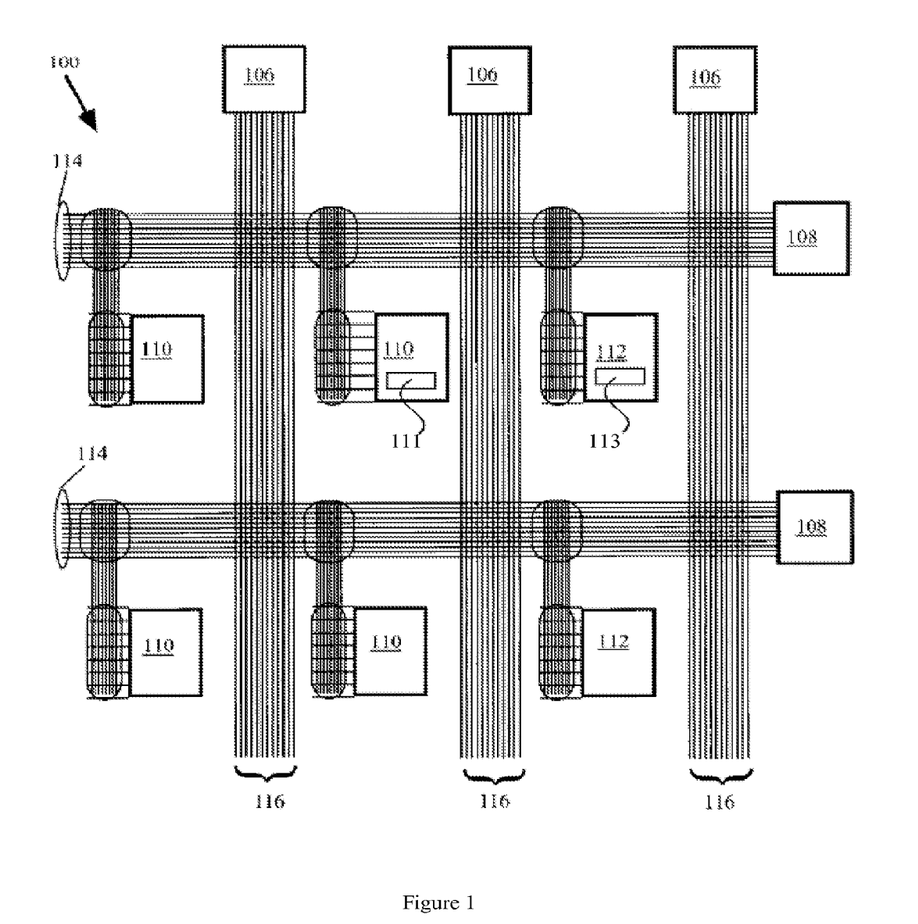
FIG. 1, meant to be illustrative and not restrictive, shows a CPLD with an embedded array programmable logic design.

FIG. 1, meant to be illustrative and not restrictive, shows a CPLD (Complex Programmable Logic Device) with an embedded array programmable logic design. One skilled in the art should appreciate that any number of logic array blocks may be used even though only a few are shown in FIG. 1. The CPLD 100 includes a plurality of embedded array blocks (EABs) 112 and a plurality of logic array blocks (LABs) 110. Each EAB 112 includes an array of memory elements 113. In different embodiments, EABs can be used to implement synchronous RAM, ROM, dual-port RAM or FIFO. Each LAB 110 includes a plurality of logic elements (LEs) 111 capable of performing specific logic functions. The plurality of LABs 110 and the plurality of EABs 112 are interconnected by a plurality of global horizontal conductors 114 and a plurality of global vertical conductors 116 to form a logic and memory array. The global horizontal conductors 114 are coupled to the horizontal ports 108, and the global vertical conductors 116 are coupled to the vertical ports 106.

Figure 1A:
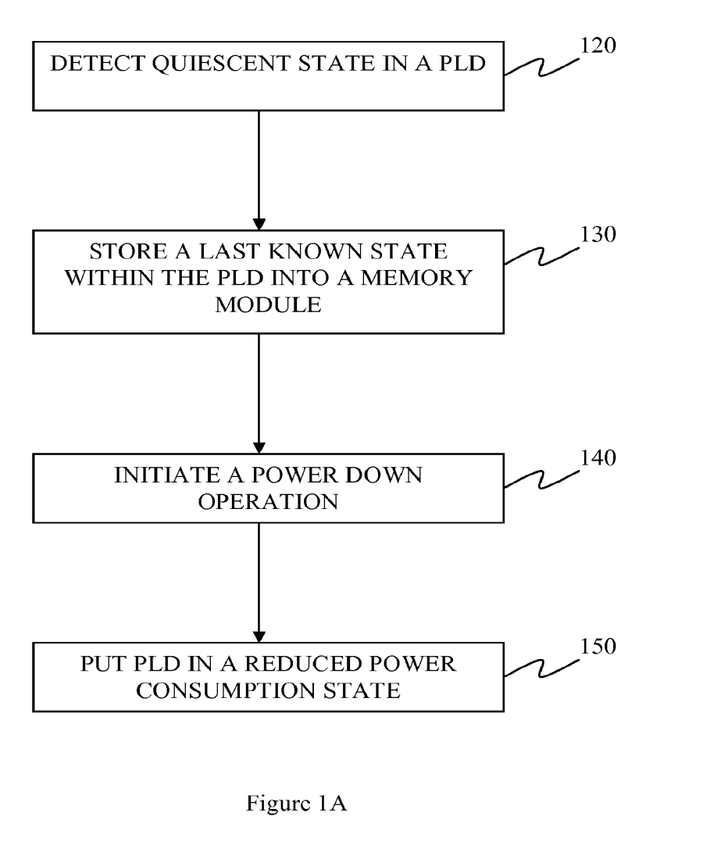
FIG. 1A shows a method of operation for reducing power consumption in a PLD by putting the PLD into a reduced power consumption state when the PLD is not in use.

FIG. 1A, in accordance to one embodiment of the invention, shows the steps for reducing power consumption in a PLD by putting the PLD into a reduced consumption power state when the PLD is not in use. A quiescent state is detected in the PLD in operation 120. In an example embodiment, a quiescent state is a state when there is no input signal to any pin for a period of time. In another embodiment, a pin is used to trigger a quiescent state in the PLD. In one embodiment, a programmable timer is used to keep track of the maximum idle time before triggering a power down operation. However, the use of a timer is only meant to be exemplary and not limiting. One skilled in the art should appreciate that other logic components can be used to detect an idle PLD, including a user initiated signal that will put the PLD into a reduced power consumption state. Once the PLD is detected to be in a quiescent state, the last known state is stored into memory in operation 130. In one embodiment, the memory used is an internal non-volatile memory, however this is exemplary and not meant to be limiting. In an example embodiment, the memory used is an on-chip user flash memory. In other embodiments, embedded volatile and non-volatile memory or external volatile and non-volatile memory can be used. A power down operation is initiated in the PLD in operation 140. The PLD is then put into a reduced power consumption state in operation 150. In one embodiment, putting the PLD in a reduced power consumption state decreases the PLD current to 0 µA.

Figure 2:
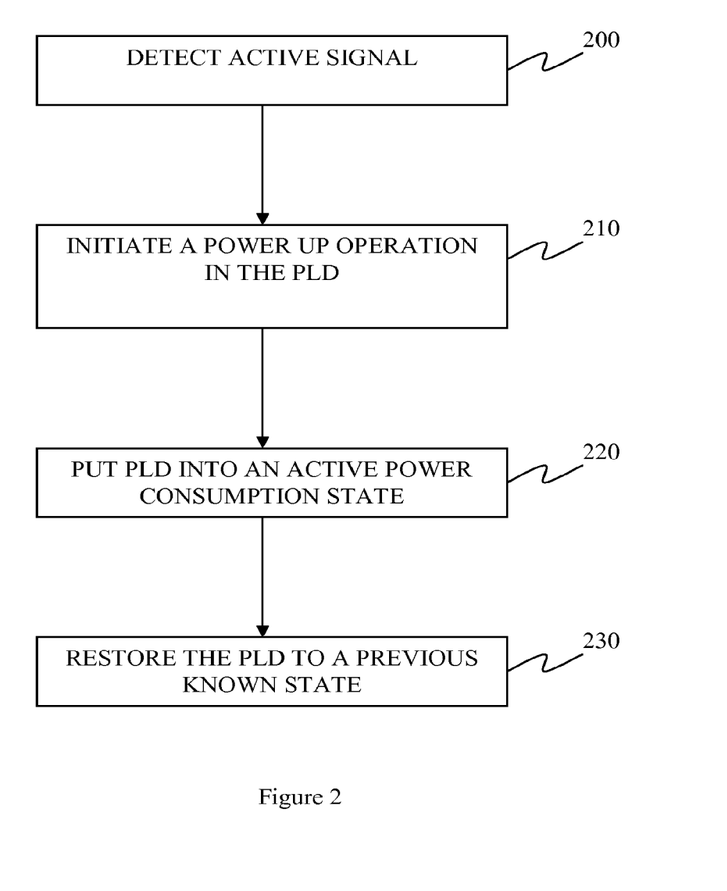
FIG. 2 shows the steps for putting a PLD into an active power consumption state and restoring the PLD to a previous known state.
Figure 9:
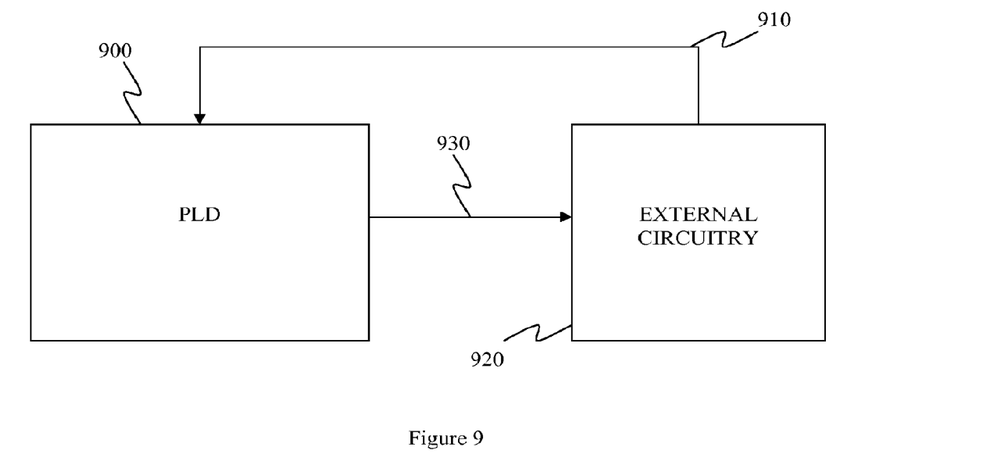
FIG. 9 shows a simplified diagram of a PLD 800 connected to an external circuitry 920 as an embodiment in accordance with the present invention.

In another embodiment in accordance with the present invention, FIG. 2 shows the steps for putting the PLD into an active power consumption state and restoring the PLD to a previous known state. An active signal is received and detected by the PLD in operation 200. Once the PLD is in active mode, a power-up operation is initiated in operation 210. Power supply is restored to the PLD in operation 220, putting the PLD into an active power consumption state. In one embodiment, the power supply is controlled by an external circuitry as shown in FIG. 9. Details of the interaction between the PLD and the circuitry to control the power supply will be described in later paragraphs. Once the PLD is in active power consumption mode, the PLD is restored to a previous known state in operation 230. In one embodiment, the previous known state is the last saved state, however this is exemplary and not meant to be limiting.

Figure 3:
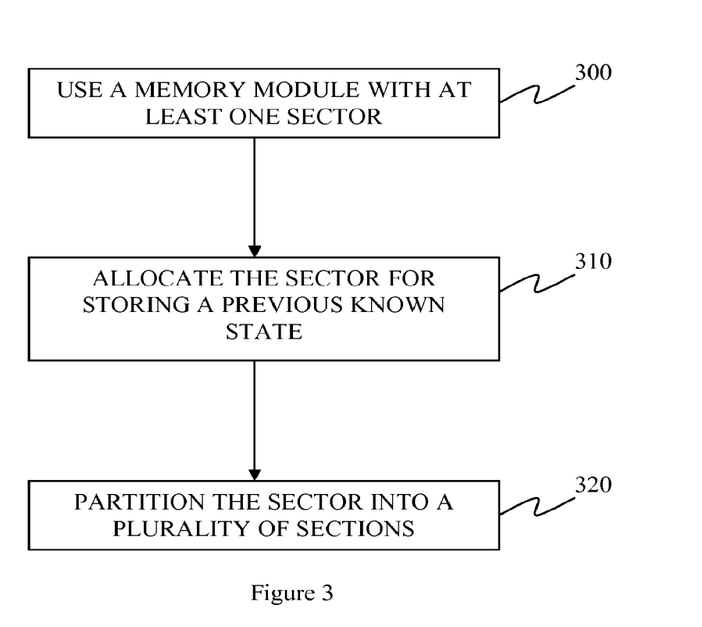
FIG. 3 is a simplified flow chart showing how a memory is partitioned according to an embodiment of the invention.

FIG. 3 shows another aspect of the invention. The PLD writes configuration data (e.g., the last saved state) to a memory module before the PLD is powered down and reads back the data from the memory module when power is restored to the PLD. The PLD therefore needs to know which location or address in the memory module to write to and subsequently be able to read from that address upon power up. A method for writing to and reading from memory is described as an embodiment in accordance with the present invention. A memory module with a plurality of sectors is used in operation 300. In another embodiment, a single sector memory may also be used. One of ordinary skill in the art will understand that the term sector is used herein in a logical sense, and need not correspond to any particular physical division of the memory module. In operation 310, one sector of the memory module is allocated for storing a previous known state. In an example embodiment, the size of the sector in the memory module is fixed and cannot be changed. However, this is exemplary and not meant to be limiting. One skilled in the art should appreciate that in other embodiments, the size of the memory sector may be alterable. The same sector is partitioned into different sections, each of the sections having a plurality of addresses, in operation 320. In one embodiment, one of the sections is a header section and another section is a data section.

Figure 4:
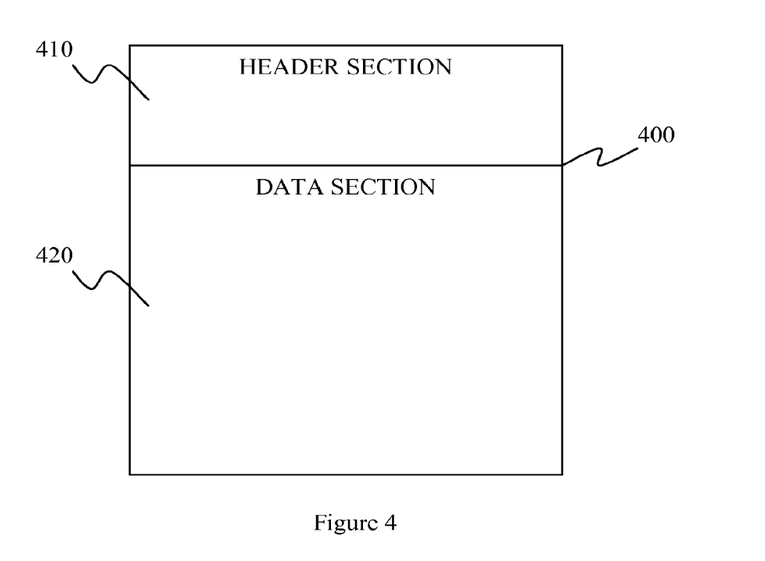
FIG. 4, meant to be illustrative and not restrictive, shows a memory sector partitioned into different sections.

FIG. 4, meant to be illustrative and not restrictive, shows how a memory sector 400 can be partitioned into a header section 410 and a data section 420, each section having a plurality of addresses. The header section is used to locate the most recent address in the data section. In an example embodiment of the present invention, a total of 256 addresses from one memory sector may be used to store a previous known state and each address in the memory sector 400 may be 16-bits wide. Fifteen of the 256 addresses may be used to store header information. In one embodiment, each bit in the header section 410 corresponds to an address in the data section 420. If there are fifteen 16-bit wide addresses in the header section 410, there will be a total of 240 addresses (15 addresses×16 bits) in the data section 420. In an example embodiment, the header section 410 is used to keep track of the most recent address used, so that when power is restored, the PLD needs to check only the header section 410 to determine the location of the previous known state in the data section 420. In one embodiment, the previous known state is the most recent saved state before the power down operation. In another embodiment, some other state other than the most recently saved state is used to restore configuration information in the PLD.

Figure 5:
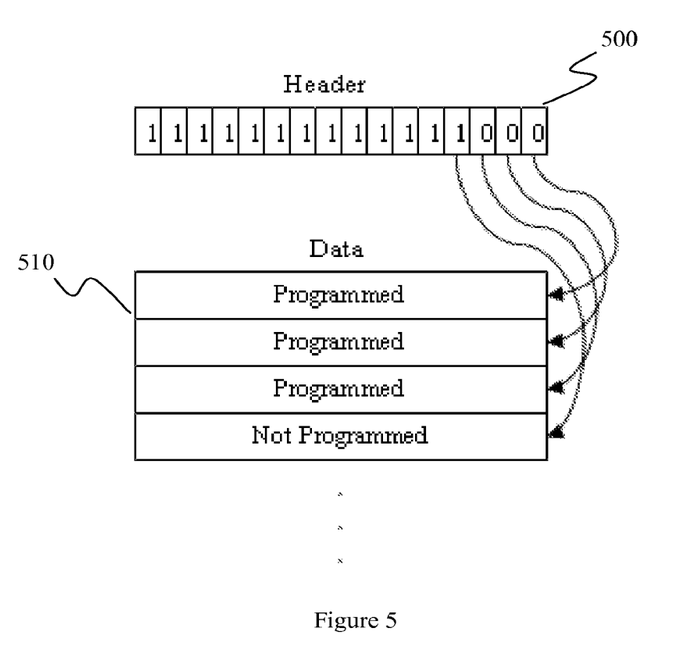
FIG. 5, meant to be illustrative and not restrictive, shows the relationship between an address in the header section 500 and addresses in the data section 510.

FIG. 5, meant to be illustrative and not restrictive, shows the relationship between an address in the header section 500 and addresses in the data section 510. Each bit in the header section 500 represents the validity of the data in a corresponding address in the data section 510. The bit '0' in an address in the header section 500, in an example embodiment, may mean that the corresponding address in the data section 510 contains valid data, while a '1' may mean that the corresponding address in the data section 510 is blank or the address contains stale or otherwise invalid data.

Figure 6:
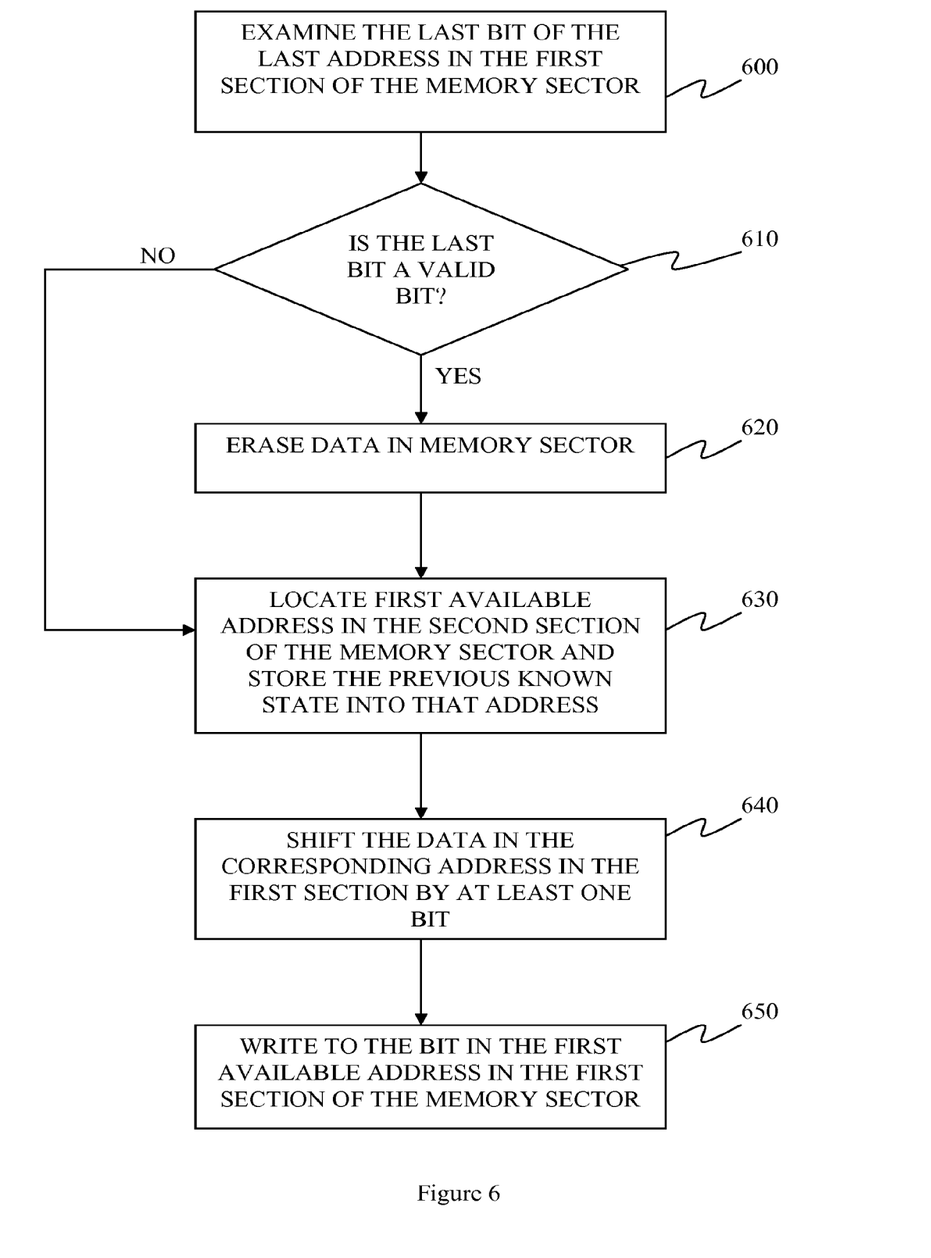
FIG. 6 is a flow chart showing the steps for storing a last known state to a memory sector.

In yet another embodiment in accordance with the present invention, FIG. 6 shows the steps for storing a last known state to a memory module. The last bit of the last address in the first section of the memory sector is examined in operation 600. In an example embodiment, the last bit of the last address in the first section corresponds to the last address in the second section because data are written to the second section—the data section—sequentially. However, this is meant to be exemplary and not limiting. The validity of the last bit of the address in the first section is checked in operation 610. If the last bit is a valid bit (i.e. the bit is not empty and contains valid data), the memory sector is full. The memory sector is erased in operation 620 if the sector is full before the previous known state is stored into the memory sector. In an example embodiment, in an erase operation, stale data in the memory sector are invalidated by writing is to all the address locations in the memory sector. In another embodiment, old data in the memory sector can be overwritten by newer state data if the memory sector is full. However, if the last bit is not a valid bit (i.e. the bit is empty), there is no need to erase the memory sector. In an example embodiment, an erase may take up to 500 ms while other memory operations can be completed in far less time. A first available address in the second section of the memory sector is located, and the previous known state is stored into that address as shown in operation 630. Data in the corresponding address in the first section is shifted by at least one bit in operation 640. A value is written to the bit in the address in the first section as shown in step 650 to indicate valid data in the corresponding address in the second section.

Figure 7:
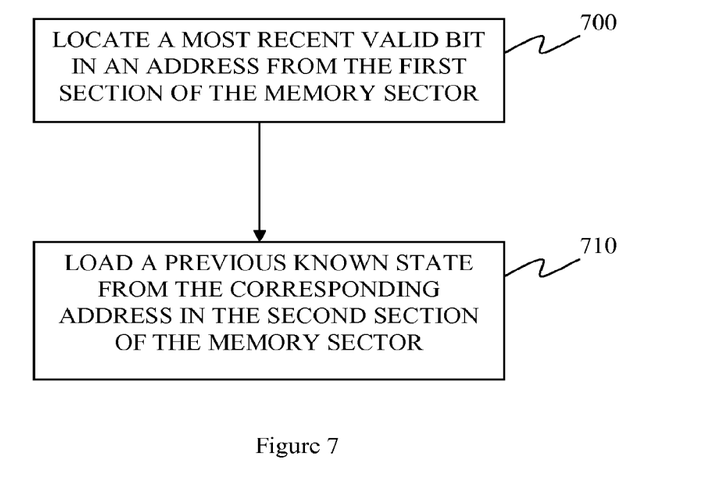
FIG. 7 is a simplified flow chart showing the steps for loading a previous known state from a memory sector.

FIG. 7 shows a simplified flow chart of an embodiment in accordance with the present invention. The most recent valid bit in an address from the first section—the header section—of the memory sector is located in operation 700. To locate the most recent valid bit, the last bit of the first address in the header section may be examined. In an example embodiment, the last bit of the first address (and all subsequent addresses) may be the most significant bit (MSB) of the address. However, this is meant to be exemplary and not limiting. In another embodiment, the least significant bit (LSB) of the address is the last bit of the first address. One skilled in the art should appreciate that a memory address can be read sequentially or non-sequentially from the LSB or the MSB. If the last bit of the address is a valid bit, the next address in the header section is checked in the same manner. If the last bit in that address is not a valid bit (i.e., empty or contains invalid data), then all the bits in that address are traversed to locate the most recent valid bit in that address. In an example embodiment, the bits in an address can be read sequentially from the least significant bit (LSB) until a first invalid bit is located. The most recent valid bit is then the bit immediately before the first invalid bit in that address. However, this is meant to be exemplary and not limiting. After the most recent valid bit is located, a previous known state is then loaded from a corresponding address in the second section—the data section—of the memory sector, as shown in operation 710.

Figure 8:
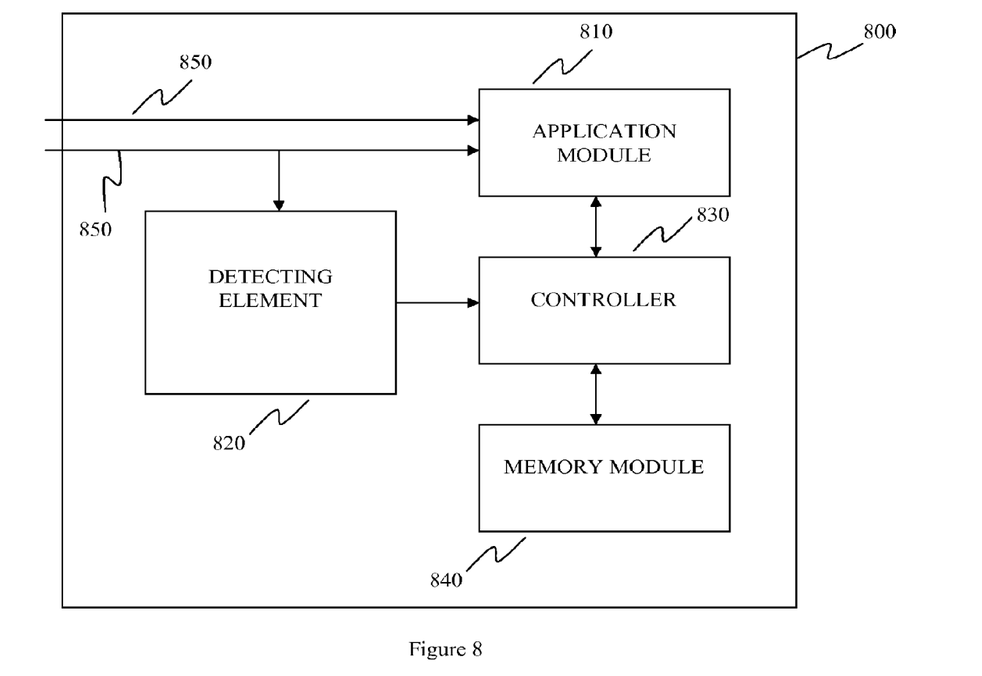
FIG. 8, meant to be illustrative and not restrictive, shows the different components in a programmable logic device (PLD).

FIG. 8 illustrates yet another embodiment of the present invention. FIG. 8 shows the different components in a programmable logic device (PLD) 800. An application module 810 within the PLD is coupled to a controller element 830. The application module 810 is a programmable design module in one embodiment. In an examplary embodiment, the application module 810 is a user-defined module. The application module 810 has two input lines 850. A memory module 840 is coupled to the controller element. In an example embodiment, the memory module 840 may be a non-volatile memory source. A detecting element 820 is coupled to the controller element 830 and to an input 850 to the application module. In one embodiment, the detecting element is a programmable timer that determines the maximum idle time before the PLD 800 is powered down. In another embodiment, user activity (i.e. input to the PLD) resets the timer. However, this is meant to be exemplary and not limiting.

FIG. 9 shows a simplified diagram of a PLD 900 connected to an external circuitry 920 as an embodiment in accordance with the present invention. The external circuitry 920 controls power supply 910 to the PLD 900. The whole system works together to reduce overall power consumption in a PLD 900. An output from the PLD 930 is coupled to the external circuitry 920. This is the output from the controller element 830 of FIG. 6 in one embodiment. In an example embodiment, the controller element 830 receives a signal from the detecting element 820 indicating that the PLD 900 of FIG. 9 should be put in a low power consumption mode. The controller element 830 of FIG. 8 then sends a signal to the external circuitry 920 of FIG. 9 to power down the system.

Figure 9A:
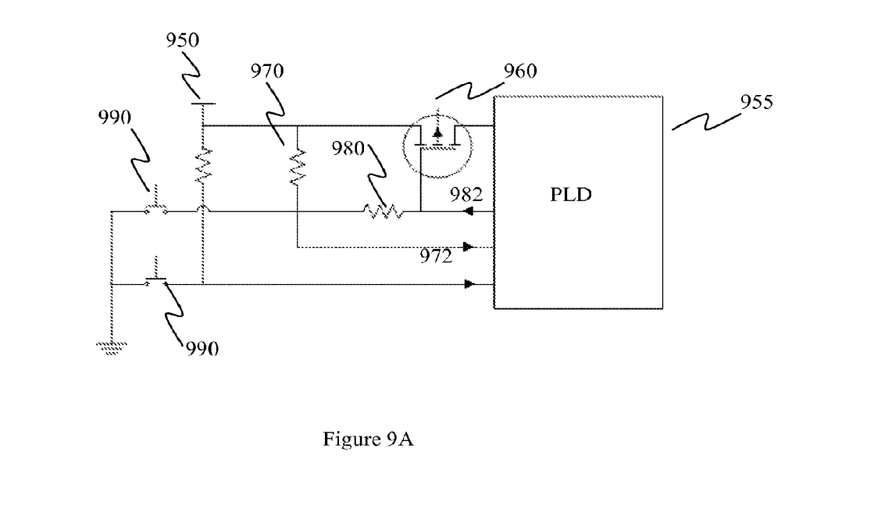
FIG. 9A, meant to be illustrative and not restrictive, shows an example circuitry that can be used to control power supply to the PLD.

FIG. 9A, meant to be illustrative and not restrictive, shows further details of an embodiment of the external circuitry 920. One skilled in the art should appreciate that any functionally similar circuitry may be used to control power supply to the PLD. As shown in FIG. 9A, the circuitry has a power source 950 coupled to a transistor 960. In an example embodiment, the transistor 960 is a P-channel metal-oxide-semiconductor field-effect transistor (MOSFET). The transistor 960 is used to control power supply to the PLD 955. One end of a resistor 970 is coupled to the power source 950 and the transistor 960 and another end of the resistor 970 is coupled to the resistor 980 and an input pin 972 to the PLD. In an example embodiment, resistor 970 pulls the transistor gate high to turn the transistor 960 off when the PLD 955 is in a low power consumption state. The resistor 980, which is coupled to the resistor 970, is also coupled to an output pin 982 of the PLD and an input terminal 990. In an embodiment, the input terminal 990 is a push button capable of receiving user input. When this button is pressed, the transistor 960 is turned on, putting the PLD 955 in active power consumption mode. In another embodiment, the PLD 955 enters user mode (i.e., ready to receive and process user input) in less than 500 μs. However, this is meant to be exemplary and not limiting.

Figure 10:
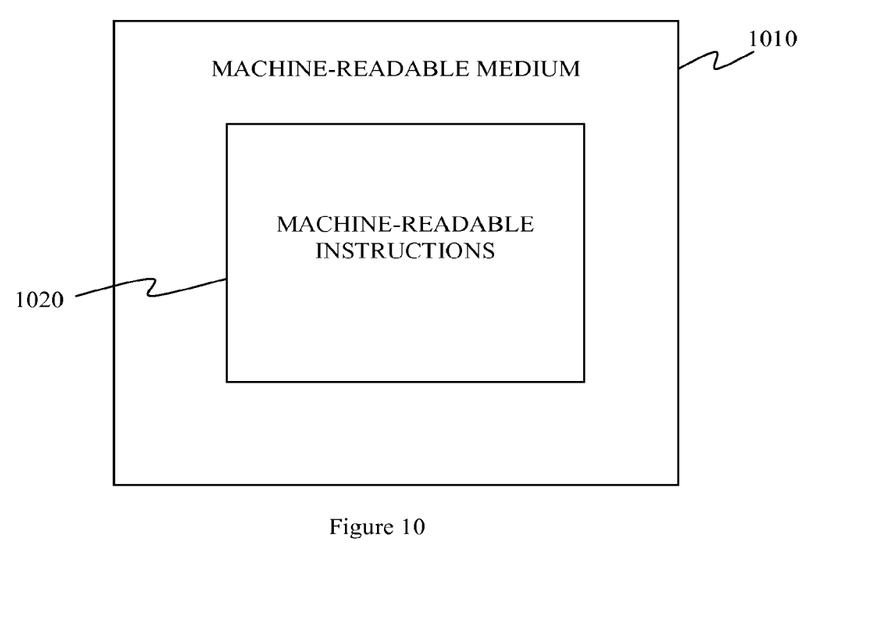
FIG. 10 is a simplified block diagram of a machine-readable medium in accordance with a possible aspect of the invention.

The invention can also be embodied as computer readable code on a computer readable medium as shown in FIG. 10. The computer readable medium 1010 is any data storage device that can store data, which can thereafter be read by a computer system. Illustrative examples of the computer readable medium include hard drives, network attached storage (NAS), read-only memory, random-access memory, CDs, DVDs, USB drives, volatile and non-volatile memory, and other optical and non-optical data storage devices. The computer readable medium can also be distributed over a network-coupled computer system so that the computer readable instructions 1020 is stored and executed in a distributed fashion. The computer readable instructions 1020 can perform the steps illustrated by FIG. 11.

Figure 11:
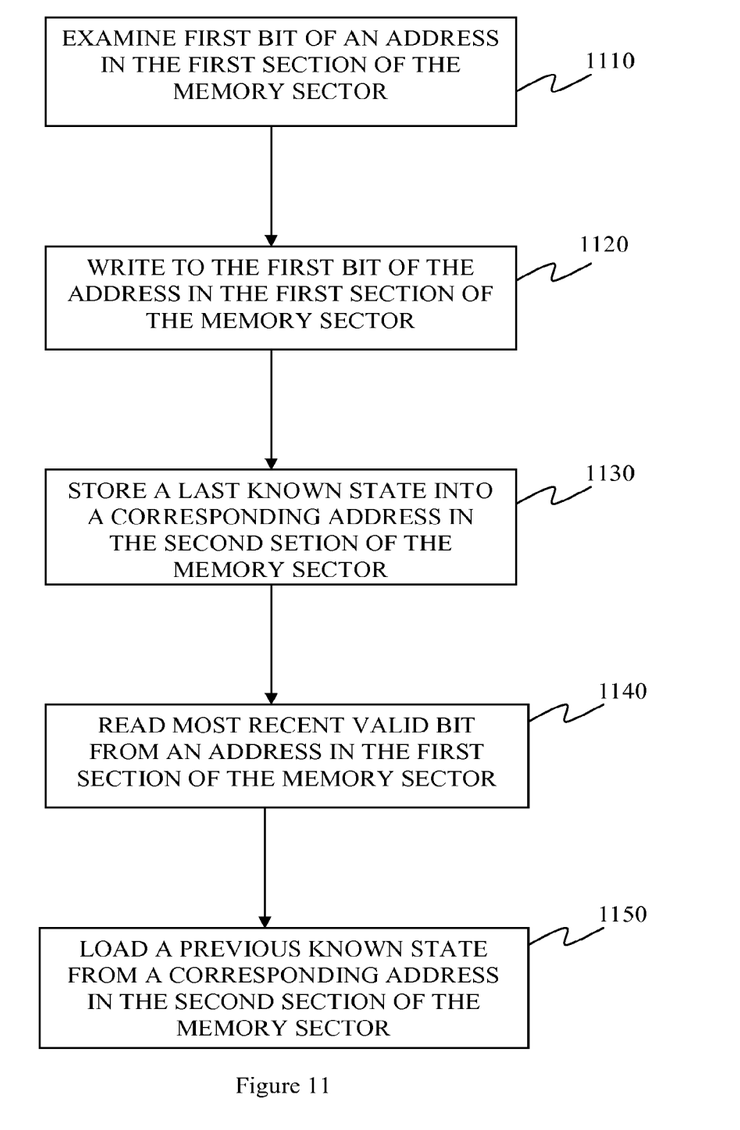
FIG. 11 is a flow chart showing a memory read and write flow in accordance with the present invention.

FIG. 11 is a flow chart showing a memory read and write flow in accordance with the present invention. A first bit of an address in the first section of the memory sector is examined in operation 1110. Then, data is written to the first bit of the address in the first section of the memory sector as shown in step 1120. A last known state is stored into a corresponding address in the second section of the memory sector in operation 1130. The most recent valid bit is then read from an address in the first section of the memory in operation 1140. A previous known state is loaded from a corresponding address in the second section of the memory sector in operation 1150.

The embodiments described above provide for an apparatus and technique to power down or place a programmable logic device in hibernation mode to essentially draw zero stand-by current. One skilled in the art will appreciate the value offered by the embodiments described herein especially with regard to battery operated applications. The register data for the last known or previous known state is stored into a non-volatile memory, such as a user flash memory. The registers are reloaded with this saved data prior to resuming operation after being powered up. A technique for utilizing different addresses in the non-volatile memory wherein 240 addresses from a sector are used for data, while 15 addresses of the sector store header information that represents validity of the data in the corresponding 240 address data section. An external circuit is utilized to control power supply to the PLD. In one embodiment, a P-channel MOSFET controls the power supply to the PLD as described with reference to FIG. 9A.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A machine-readable medium encoded with machine-readable instructions for preserving a previous known state of a programmable logic device,
comprising:
program instructions for examining a first bit of an address in a first section of a sector in a memory module;
program instructions for writing to the first bit of the address;
program instructions for storing the previous known state into a first address in a second section of the sector in the memory module, wherein the address in the second section corresponds to the first bit of the address in the first section;
program instructions for reading a most recent valid bit from an address in the first section; and
program instructions for loading the previous known state from a corresponding address in the second section, wherein the corresponding address is located by the reading of the most recent valid bit in the first section.

2. The machine readable medium of claim 1, wherein the first section is a header section and wherein each bit represents validity of data in the second section.

3. The machine readable medium of claim 1, wherein the first section includes 15 addresses and the second section includes 240 addresses, and wherein a spare address is located between the first and the second sections.

4. The machine readable medium of claim 1, wherein each bit in the first section corresponds to an address in the second section.

5. The machine readable medium of claim 1, further comprising:
   erasing the sector of the memory module in response to detecting that the sector was full prior to the previous known state being stored into the memory sector.

6. A power control system for an integrated circuit (IC) comprising:
   a flash memory comprising sectors, each of the sectors having a first section and a second section;
   a timeout detector coupled to an input signal of the IC, the timeout detector identifying a quiescent state in the IC, wherein the timeout detector initiates storage of a last known state of the flash memory responsive to detecting the quiescent state, the last known state of the memory stored into a first address in the second section of a sector in the flash memory, wherein the address in the second section corresponds to a first bit of the address in the first section; and
   a controller element coupled to the timeout detector and the flash memory.

7. The power control system of claim 6, further comprising:
   circuitry coupled to the controller element, wherein the circuitry controls power supply to the IC, and wherein the controller element is transmits a signal to the circuitry to initiate a power down operation.

8. The power control system of claim 7, wherein the circuitry is external to the IC.

9. The power control system of claim 7, wherein the circuitry comprises:
   a power source;
   a transistor coupled to the power source;
   a first resistor, wherein a first terminal of the first resistor is coupled to the power source and the transistor and a second terminal is coupled to a first input terminal of the circuitry and a first input pin of the IC;
   a second resistor, wherein a first terminal of the second resistor is coupled to the transistor, the power source, and the first resistor, and a second terminal is coupled to a second input pin of the IC; and
   a third resistor, wherein a first terminal of the third resistor is coupled to the transistor and an output pin of the IC and a second terminal is coupled to a second input terminal of the circuitry.

10. The circuitry of claim 9, wherein the second and third resistors are operable to drive the transistor.

11. The circuitry of claim 9, wherein the transistor is a P-channel MOSFET operable to control power supply to the IC.

12. The circuitry of claim 9, wherein the second input terminal receives a signal to drive the transistor to power up the IC.

13. The circuitry of claim 9, wherein the second resistor is a pull-up resistor.

14. The circuitry of claim 6, wherein the IC is a programmable logic device (PLD).

15. The circuitry of claim 6, wherein the flash memory is non-volatile memory of the integrated circuit.

* * * * *